(12) United States Patent
Saito et al.

(10) Patent No.: US 9,972,438 B2
(45) Date of Patent: May 15, 2018

(54) LAMINATED CERAMIC ELECTRONIC COMPONENT

(71) Applicant: Murata Manufacturing Co., Ltd., Nagaokakyo-shi, Kyoto-fu (JP)

(72) Inventors: Yoshito Saito, Nagaokakyo (JP); Yosuke Hirata, Nagaokakyo (JP); Takashi Hiramatsu, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days. days.

(21) Appl. No.: 15/172,199

(22) Filed: Jun. 3, 2016

(65) Prior Publication Data

US 2016/0284474 A1    Sep. 29, 2016

Related U.S. Application Data

(63) Continuation of application No. 13/856,475, filed on Apr. 4, 2013, which is a continuation of application No. PCT/JP2011/077887, filed on Dec. 2, 2011.

(30) Foreign Application Priority Data

Dec. 6, 2010 (JP) ................................. 2010-271097

(51) Int. Cl.
*C03B 29/00*   (2006.01)
*H01G 4/005*   (2006.01)
*H01G 4/06*    (2006.01)
(Continued)

(52) U.S. Cl.
CPC ............. *H01G 4/258* (2013.01); *H01G 4/005* (2013.01); *H01G 4/012* (2013.01); *H01G 4/12* (2013.01);
(Continued)

(58) Field of Classification Search
CPC .......... H01G 4/258; H01G 4/005; H01G 4/08; H01G 4/12; H01G 4/30; H01G 4/012;
(Continued)

(56) References Cited

U.S. PATENT DOCUMENTS 6,295,196 B1 *   9/2001   Hamaji ................ H01G 4/0085
                                                              361/321.2
6,303,529 B1    10/2001   Wada et al.
6,912,115 B2     6/2005   Kobayashi et al.
7,324,325 B2     1/2008   Kojima et al.
2001/0055192 A1 * 12/2001  Nakano .................... H01G 4/30
                                                              361/306.3

FOREIGN PATENT DOCUMENTS

CN          1279490 A       1/2001
CN         101034620 A      9/2007
(Continued)

OTHER PUBLICATIONS

Kobayashi, "JP 2005-259772, machine translation", published Sep. 22, 2005.*
PCT/JP2011/077887 Written Opinion dated Feb. 2, 2012.

*Primary Examiner* — Alex Efta
(74) *Attorney, Agent, or Firm* — Arent Fox LLP

(57) ABSTRACT

A method for manufacturing a laminated ceramic capacitor having a laminated body including a plurality of stacked ceramic layers and internal electrodes located between the ceramic layers. The laminated body has a pair of mutually opposed principal surfaces extending in the direction in which the ceramic layers extend, a pair of mutually opposed side surfaces and a pair of mutually opposed end surfaces which respectively extend in directions orthogonal to the principal surfaces. The internal electrodes are 0.4 μm or less in thickness, and are located in an area defined by a width-direction gap of 30 μm or less interposed with respect to each of the pair of side surfaces and an outer layer thickness of 35 μm or less interposed with respect to each of the pair of principal surfaces.

13 Claims, 2 Drawing Sheets

(51) Int. Cl.

| | |
|---|---|
| *H01G 4/20* | (2006.01) |
| *H01G 4/258* | (2006.01) |
| *H05K 3/46* | (2006.01) |
| *H01G 4/30* | (2006.01) |
| *H01G 4/012* | (2006.01) |
| *H05K 3/12* | (2006.01) |
| *H05K 1/16* | (2006.01) |
| *H01G 4/12* | (2006.01) |

(52) U.S. Cl.
CPC ............. *H01G 4/30* (2013.01); *H05K 3/1291* (2013.01); *H05K 3/4629* (2013.01); *H05K 3/4664* (2013.01); *H01G 4/1209* (2013.01); *H05K 1/162* (2013.01); *H05K 3/1216* (2013.01)

(58) Field of Classification Search
CPC ...... H05K 3/12; H05K 3/4664; H05K 3/1291; H05K 3/4629; H05K 3/1216; H05K 1/162; H05K 2201/09209
See application file for complete search history.

(56) References Cited

FOREIGN PATENT DOCUMENTS

| | | | |
|---|---|---|---|
| JP | 2000353636 A | 12/2000 | |
| JP | 2003234242 A | 8/2003 | |
| JP | 2005136132 A | 5/2005 | |
| JP | 2005259772 A * | 9/2005 | |
| JP | 2005259772 A | 9/2005 | |
| WO | WO 0101427 A1 * | 1/2001 | ............. H01G 4/005 |

* cited by examiner

LAMINATED CERAMIC ELECTRONIC COMPONENT

CROSS REFERENCE TO RELATED APPLICATIONS

The present application is a continuation of application Ser. No. 13/856,475, filed Apr. 4, 2013, which is a continuation of International application No. PCT/JP2011/077887, filed Dec. 2, 2011, and which claims priority to Japanese Patent Application No. 2010-271097, filed Dec. 6, 2010, the entire contents of each of which are incorporated herein by reference.

FIELD OF THE INVENTION

This invention relates to a laminated ceramic electronic component, and more particularly, relates to an improvement for enhancing the thermal shock resistance of a laminated ceramic electronic component.

BACKGROUND OF THE INVENTION

For example, JP 2005-136132 A (Patent Document 1) discloses a technique for promoting the resistance of a laminated ceramic capacitor to thermal stress.

More specifically, Patent Document 1 discloses a laminated ceramic capacitor including, as a main body section, a laminated body formed by arranging dielectric layers each between a plurality of internal electrodes to be stacked in the stacking direction, and placing a dielectric around the plurality of internal electrodes, characterized in that a pair of upper and lower margin sections (outer layer sections) without any internal electrodes present is each placed between end surfaces (principal surfaces) located in the stacking direction of the laminated body and the internal electrodes closest to the end surfaces (principal surfaces) located in the stacking direction, a pair of right and left margin sections (width-direction gap sections) without any internal electrodes present is each placed between end surfaces (side surfaces) located in a crossing direction with respect to the stacking direction of the laminated body and the ends of the internal electrodes, the upper and lower margin sections (outer layer sections) and the right and left margin sections (width-direction gap sections) each have a dimension of 50 to 200 µm, and the difference in dimension between the upper and lower margin sections (outer layer sections) and the right and left margin sections (width-direction gap sections) falls within 20% of the dimension of the upper and lower margin sections.

Patent Document 1 reports that a laminated ceramic capacitor which has high resistance to thermal stress is supposed to be achieved even when a large number of internal electrodes are stacked. While thermal shocks are applied to laminated ceramic capacitors in, for example, solder reflow mounting, a thermal stress test at 280° C. is carried out in an example described in Patent Document 1, and thus, the ability to bear this thermal stress test means the ability to withstand thermal shocks in solder reflow mounting.

However, there has been a growing demand for a higher level of thermal shock resistance in recent years. For example, in cases such as a laminated ceramic capacitor used near an automobile engine room, or a substrate with a laminated ceramic capacitor mounted thereon, which is further joined with some sort of substrate by welding or the like, there is a demand for a higher level of thermal shock resistance. The technique disclosed in Patent Document 1 may fail to deal with some of such cases, and as a result of thermal shock, laminated ceramic capacitors may suffer structural defects such as cracks.

While laminated ceramic capacitors have been described above, laminated ceramic electronic components other than laminated ceramic capacitors can encounter the same problem.

Patent Document 1: JP 2005-136132 A

SUMMARY OF THE INVENTION

Therefore, an object of this invention is to provide a laminated ceramic electronic component which can achieve a higher level of thermal shock resistance.

This invention is directed to a laminated ceramic electronic component comprising a laminated body including a plurality of stacked ceramic layers and a plurality of internal electrodes located between the ceramic layers, the laminated body having a pair of mutually opposed principal surfaces extending in a direction in which the ceramic layers extend, as well as a pair of mutually opposed side surfaces and a pair of mutually opposed end surfaces, the side surfaces and the end surfaces respectively extending in directions orthogonal to the principal surfaces, the internal electrodes extracted to either one of the pair of end surfaces, and distributed in an area located with a width-direction gap interposed with respect to each of the pair of side surfaces and located with an outer layer thickness interposed with respect to each of the pair of principal surfaces.

In the laminated ceramic electronic component, a first aspect of this invention is characterized by meeting a first condition that the internal electrode is 0.4 µm or less in thickness and a second condition that the width-direction gap is 30 µm or less or the outer layer thickness is 35 µm or less, in order to solve the technical problem mentioned previously.

For a second aspect of this invention, conditions are required which are severer than in the case of the first aspect. More specifically, the first condition that the internal electrode is 0.4 µm or less in thickness is the same as in the case of the first aspect, while the second condition is both the width-direction gap of 30 µm or less and the outer layer thickness of 35 µm or less.

This invention is, in a third aspect thereof, adapted to further meet a third condition that a coverage for the internal electrodes is 75% or more, in addition to the first and second conditions in the first or second aspect.

This invention makes it possible to withstand a thermal shock of a high load such as, for example, 500° C., as will become clear from experimental examples below. Therefore, the laminated ceramic electronic component according to this invention can adequately withstand, for example, cases such as the laminated ceramic electronic component used near an automobile engine room, or a substrate with the laminated ceramic electronic component thereon, which is further joined with some sort of substrate by welding or the like.

The laminated ceramic electronic component can be adapted to withstand a thermal shock of a higher load in the case of meeting the conditions according to the second aspect, as compared with the case of meeting the conditions according to the first aspect, and furthermore, can be adapted to withstand a thermal shock of a higher load in the case of meeting the conditions according to the third aspect, as compared with the case of meeting the conditions according to the second aspect.

In general, when a thermal shock is applied to a laminated ceramic electronic component, the difference in coefficient of thermal expansion between the ceramic section and the metal section of internal electrodes can generate stress to cause structural defects such as cracks. Then, when the structural defects are extended from specific starting points to reach the inner layer section with internal electrodes present therein, the defects will cause short circuit defects or deterioration in moisture resistance.

The previously disclosed technique disclosed in Patent Document 1 has the idea that, briefly speaking, the upper and lower margin sections (outer layer sections) and the right and left margin sections (width-direction gap sections) are further increased in dimension to 50 μm or more, to keep cracks caused by thermal stress, if any, from reaching a capacitance forming section.

In contrast, in this invention, the internal electrodes are reduced in thickness to 0.4 μm or less to suppress the generation of stress due to the difference in coefficient of thermal expansion, while the width-direction gap and/or the outer layer thickness are reduced in contrast to the case of Patent Document 1 to suppress the generation of structural defects such as cracks due to thermal shocks. More specifically, the concept is that stress itself caused by thermal stress is reduced to suppress the generation of cracks as much as possible.

DETAILED DESCRIPTION OF THE INVENTION

Figure 1:
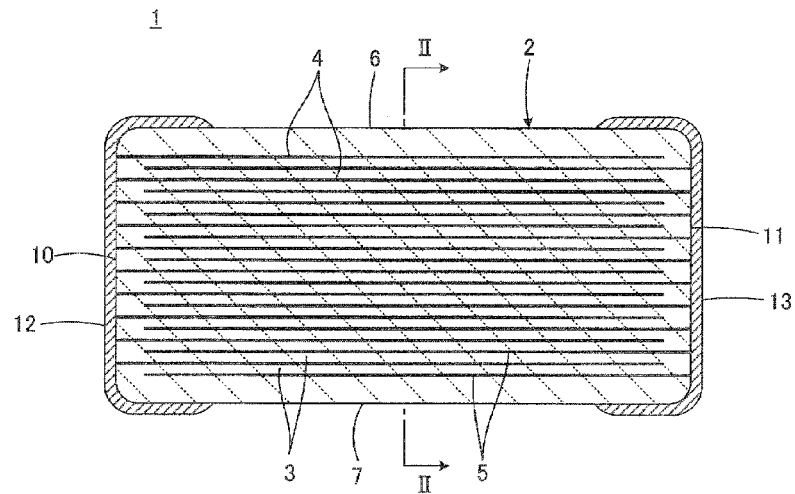
FIG. 1 is a cross-sectional view illustrating a laminated ceramic capacitor as an example of a laminated ceramic electronic component according to an embodiment of this invention.

The structure of a laminated ceramic capacitor 1 as an example of a laminated ceramic electronic component obtained by applying this invention will be described with reference to FIGS. 1 and 2.

The laminated ceramic capacitor 1 includes a laminated body 2 as a component main body. The laminated body 2 includes a plurality of stacked ceramic layers 3 and a plurality of internal electrodes 4 and 5 located between the ceramic layers 3. The internal electrodes 4 and the internal electrodes 5 are arranged alternately in the stacking direction.

The laminated body 2 forms a cuboidal shape or a substantially cuboidal shape which has a pair of mutually opposed principal surfaces 6 and 7 extending in the direction in which the ceramic layers 3 extend, as well as a pair of mutually opposed side surfaces 8 and 9 and a pair of mutually opposed end surfaces 10 and 11 which respectively extend in directions orthogonal to the principal surfaces 6 and 7.

The end surfaces 10 and 11 of the laminated body 2 respectively have the plurality of internal electrodes 4 and 5 extracted thereto, and the respective ends exposed thereto, and external electrodes 12 and 13 are formed respectively so as to electrically connect the respective ends of the internal electrodes 4 to each other and the respective ends of the internal electrodes 5 to each other.

Figure 2:
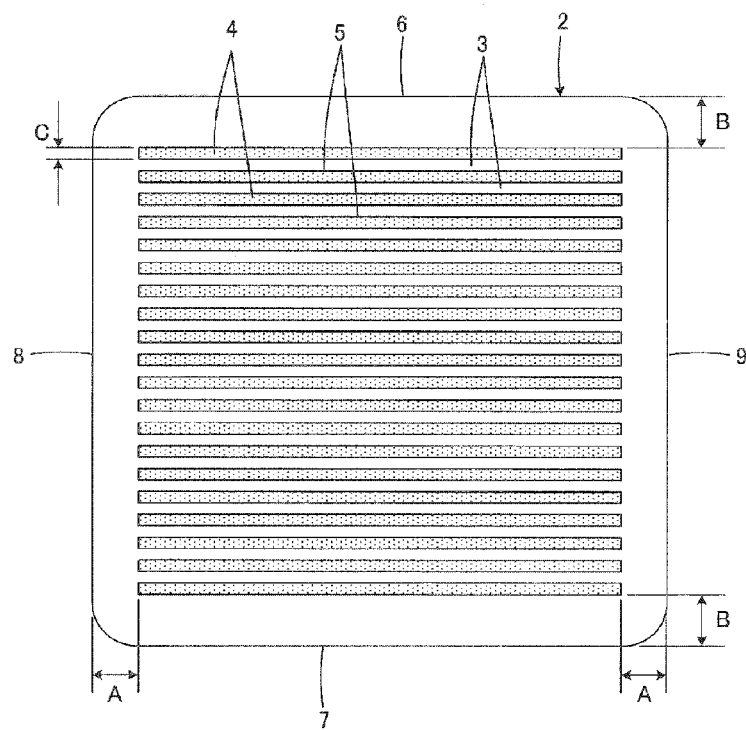
FIG. 2 is an enlarged cross-sectional view along the line II-II of FIG. 1.

The internal electrodes 4 and 5 are, as shown in FIG. 2, distributed in an area located with a predetermined width-direction gap A interposed with respect to each of the pair of side surfaces 8 and 9, and located with a predetermined outer-layer thickness B interposed with respect to each of the pair of principal surfaces 6 and 7.

This laminated ceramic capacitor 1 according to this invention meets the first condition that the internal electrodes 4 and 5 each have a thickness C of 0.4 μm or less, and the second condition that the width-direction gap A is 30 μm or less or the outer-layer thickness B is 35 μm or less.

More preferably, as for the second condition, the capacitor is adapted to meet both the width-direction gap A of 30 μm or less and the outer-layer thickness B of 35 μm or less. In this preferred embodiment, more preferably, the capacitor is adapted to meet the third condition that the coverage for the internal electrodes 4 and 5 is 75% or more.

It is to be noted that because of actual manufacturing problems, it is expected that the thickness C for each of the internal electrodes 4 and 5 has a lower limit on the order of 0.05 μm, the outer-layer thickness B has a lower limit on the order of 5 μm, and the width-direction gap A has a lower limit on the order of 5 μm.

For manufacturing this laminated ceramic capacitor 1, ceramic green sheets to serve as the ceramic layers 3 are first prepared, and conductive paste films to serve as the internal electrodes 4 and 5 are formed by printing onto the ceramic green sheets. Next, the multiple ceramic green sheets are stacked to prepare an unfired laminated body to serve as the laminated body 2, which includes a plurality of unfired ceramic layers and the conductive paste films located between the unfired ceramic layers.

Then, a firing step is carried out for making the unfired laminated body sintered. Then, the external electrodes 12 and 13 are respectively formed on the end surfaces 10 and 11 of the sintered laminated body 2, thereby completing the laminated ceramic capacitor 1.

When the thickness C for the internal electrodes 4 and 5 is reduced to 0.4 μm or less in order to meet the first condition mentioned above, it is not easy to meet the third condition that the coverage is kept at 75% or more. For example, when the firing temperature is lowered, it is easy to keep the coverage at 75% or more, whereas the ceramic is somewhat insufficiently sintered.

In order to solve this problem, it is effective to carry out, in the firing step, a heat treatment step in which a temperature profile is applied at an average rate of temperature increase of 40° C./second or more, preferably 100° C./second or more up to a maximum temperature, and further desirably to carry out cooling without keeping the maximum temperature after reaching the temperature in order to reduce the heat quantity. When the firing step is carried out under this condition, the coverage for the internal electrodes 4 and 5 can be kept high while making the ceramic sufficiently sintered.

In addition, the unfired laminated body is preferably subjected to a degreasing treatment before the heat treatment step described above in the firing step.

When the internal electrodes 4 and 5 contain a base metal such as Ni as a conductive constituent, the heat treatment step may be carried out in an atmosphere supplied with an atmosphere gas which is oxidative with respect to the equilibrium oxygen partial pressure of the base metal.

When this invention is directed to the laminated ceramic capacitor 1 shown in FIG. 1 as described above, the ceramic layers 3 are composed of dielectric ceramic. However, this invention may be applied to not only laminated ceramic capacitors, but also inductors, thermistors, piezoelectric components, etc. Therefore, depending on the function of the laminated ceramic electronic component, the ceramic layers may be composed of, in addition to dielectric ceramic, magnetic ceramic, semiconductor ceramic, piezoelectric ceramic, etc.

In addition, while the laminated ceramic capacitor 1 shown in FIG. 1 is a two-terminal capacitor including two external terminals 12 and 13, this invention can be also applied to multi-terminal laminated ceramic electronic components.

Experimental examples will be described below which were carried out for confirming the advantageous effects of this invention.

Experimental Example 1

(1) Preparation of Samples

Ceramic green sheets including: ceramic powder containing barium titanate as its main constituent; and an organic binder were formed on base films so as to be 1 μm in thickness after firing. Then, conductive paste films to serve as internal electrodes were formed by screen printing onto the ceramic green sheets, so as to achieve the thickness shown in the column "Thickness of Internal Electrode" in Tables 1 and 2 after the firing. In this case, the dimensions of the printing pattern for the conductive paste films were adjusted so that internal electrodes were distributed in a region located with a width-direction gap interposed as shown in the column "Width-Direction Gap" in Tables 1 and 2, in laminated bodies obtained through subsequent cutting step and firing step.

Next, the green sheets with the conductive paste films formed thereon were stacked a predetermined number of times so as to alternate the sides to which the conductive paste films were extracted, and further so as to sandwich these sheets, green sheets for an outer layer section without any conductive paste films formed were stacked a predetermined number of times, and heated and pressed to prepare laminated body blocks. In this case, the number of stacked green sheets for an outer layer section was adjusted so as to achieve the "Outer Layer Thickness" in Tables 1 and 2 after the firing.

Next, the laminated body blocks were cut with a dicing saw to obtain unfired laminated bodies.

Next, the unfired laminated bodies obtained were subjected, for degreasing, to a heat treatment with a maximum temperature of 240° C. in $N_2$ stream. Continuously, the laminated bodies were subjected to firing with a maximum temperature of 1180° C. under an atmosphere with an oxygen partial pressure of $10^{-9.5}$ MPa in $N_2$—$H_2O$—$H_2$ stream.

For the sintered laminated bodies obtained in this way, external electrodes were formed on the end surface sections with the internal electrodes extracted thereto. More specifically, a conductive paste containing copper as its main constituent was applied, and subjected to baking at 800° C. to form base layers, and Ni plating films and Sn plating films were formed thereon by wet plating.

Laminated ceramic capacitors according to each sample were obtained in the way described above. The obtained laminated ceramic capacitors including the external electrodes achieved the external dimensions as shown in the "Length-Direction Dimension", "Width-Direction Dimension", and "Thickness-Direction Dimension" of Tables 1 and 2.

Next, it was confirmed in the following way that the laminated ceramic capacitors obtained achieved the values in the "Thickness of Internal Electrode", "Outer Layer Thickness", and "Width-Direction Gap" as shown in Tables 1 and 2.

(2) Thickness of Internal Electrode

Three laminated ceramic capacitors were prepared for each sample. These laminated ceramic capacitors were encased in a resin so as to barely present the end surfaces, and the end surfaces were polished in the length directions of the laminated ceramic capacitors to obtain polished cross sections at ½ in the length directions. Next, these polished cross sections were subjected to ion milling to remove drops produced by the polishing. In this way, cross sections for observation were obtained.

Next, the group of internal electrodes was divided into three equal parts with respect to the thickness direction of the sample, which were classified in three regions of: an upper area; a middle area; and a lower area. In addition, in the cross section, a perpendicular line was drawn which was orthogonal to the internal electrodes and divided the internal electrodes into two equal parts in the width direction. Then, twenty-five layers of internal electrodes were selected from each of the central parts of the three regions, and the thicknesses of these internal electrodes were measured on the perpendicular line.

Thus, the thickness of the internal electrode was measured at 75 points for one sample, and the thickness of the internal electrode was obtained at 225 points in total for the three samples in total to figure out the average value of these thicknesses. However, the points with the defective internal electrodes were not counted.

As a result, it was confirmed that the average value for the thickness of the internal electrode for each sample was nearly the targeted value as shown in the column "Thickness of Internal Electrode" of Tables 1 and 2.

(3) Width Direction Gap

The cross sections for observation, obtained in the section (2), were used for figuring out the width direction gap. Seven layers of internal electrodes were specified which were located to divide the area with the internal electrodes present therein into six equal parts with respect to the thickness direction of the sample. In the locations of the five layers of internal electrodes after excluding the uppermost layer of internal electrode and the lowermost layer of internal electrode among these seven layers of internal electrodes, the width direction gap was measured at 10 points in total on both the right-hand side and left-hand side. Then, the value of the width-direction gap was obtained at 30 points in total for the three samples in total to figure out the average value of these values.

As a result, it was confirmed that the average value for the width-direction gap for each sample was nearly the targeted value as shown in the column "Width Direction Gap" of Tables 1 and 2.

(4) Outer Layer Thickness

First of all, the cross sections for observation, obtained in the section (2), were used for figuring out the outer layer thickness. Seven perpendicular lines were drawn which were orthogonal to the internal electrodes and divided the internal electrodes into six equal parts in the width direction. On the five perpendicular lines after excluding the two outermost perpendicular lines among these seven perpendicular lines, the outer layer thickness was measured at 10 points in total on both the upper side and lower side. Then, the outer layer thickness was first obtained at 30 points in total for the three samples in total.

Secondly, three laminated ceramic capacitors were further prepared for each sample. These laminated ceramic capacitors were encased in a resin so as to barely present the side surfaces, and the side surfaces were polished in the width directions of the laminated ceramic capacitors to obtain polished cross sections at ½ in the width directions. Next, these polished cross sections were subjected to ion milling to remove drops produced by the polishing. In this way, second cross sections for observation were obtained.

In this second cross section, perpendicular lines were drawn which were orthogonal to the internal electrodes and divide the overlap region of the internal electrodes (the region except for the length-direction gaps) into six equal parts in the length direction. On the five perpendicular lines after excluding the two outermost perpendicular lines among these seven perpendicular lines, the outer layer thickness was measured at 10 points in total on both the upper side and lower side. Then, the outer layer thickness was further obtained at 30 points in total for the three samples in total.

Thus, the average value was figured out for the outer layer thicknesses at 60 points in total for the six samples in total. As a result, it was confirmed that the outer layer thickness for each sample had nearly the targeted value as shown in the column "Outer Layer Thickness" of Tables 1 and 2.

It is to be noted that the coverage for the internal electrodes was about 80% for all of samples 1 to 74 shown in Tables 1 and 2. As for the coverage, the laminated body was subjected to peeling, and then, the surface near the center of the internal electrode pattern at the peeled surface was observed under an optical microscope to figure out the ratio of the area with the internal electrode present therein, and regard this ratio as the coverage.

(5) Evaluation

The laminated ceramic capacitors according to each sample were subjected to a thermal shock test as follows.

The thermal shock test was carried out in which the laminated ceramic capacitors according to each sample were immersed for 2 seconds in a solder bath at a temperature of 500° C., and the presence or absence of structural defect generation was evaluated by optical microscopic observation. This evaluation was performed for hundred samples to figure out the ratio of the number of samples with structural defects generated. The results are shown in the column "Defect Generation Ratio" of Tables 1 and 2.

TABLE 1

| Sample Number | Length Direction Dimension [mm] | Width Direction Dimension [mm] | Thickness Direction Dimension [mm] | Thickness of Internal Electrode [μm] | Thickness of Outer Layer [μm] | Width Direction Gap [μm] | Defect Generation Ratio [%] |
|---|---|---|---|---|---|---|---|
| 1 | 3.2 | 1.6 | 1.6 | 1.0 | 30 | 30 | 100 |
| 2 | 3.2 | 1.6 | 1.6 | 1.0 | 60 | 30 | 100 |
| 3 | 3.2 | 1.6 | 1.6 | 1.0 | 120 | 30 | 100 |
| 4 | 3.2 | 1.6 | 1.6 | 1.0 | 30 | 60 | 100 |
| 5 | 3.2 | 1.6 | 1.6 | 1.0 | 60 | 60 | 100 |
| 6 | 3.2 | 1.6 | 1.6 | 1.0 | 120 | 60 | 100 |
| 7 | 3.2 | 1.6 | 1.6 | 1.0 | 30 | 120 | 100 |
| 8 | 3.2 | 1.6 | 1.6 | 1.0 | 60 | 120 | 100 |
| 9 | 3.2 | 1.6 | 1.6 | 1.0 | 120 | 120 | 100 |
| 10 | 2.0 | 1.2 | 1.2 | 1.0 | 35 | 25 | 100 |
| 11 | 2.0 | 1.2 | 1.2 | 1.0 | 70 | 25 | 100 |
| 12 | 2.0 | 1.2 | 1.2 | 1.0 | 140 | 25 | 100 |
| 13 | 2.0 | 1.2 | 1.2 | 1.0 | 35 | 50 | 100 |
| 14 | 2.0 | 1.2 | 1.2 | 1.0 | 70 | 50 | 100 |
| 15 | 2.0 | 1.2 | 1.2 | 1.0 | 140 | 50 | 100 |
| 16 | 2.0 | 1.2 | 1.2 | 1.0 | 35 | 100 | 100 |
| 17 | 2.0 | 1.2 | 1.2 | 1.0 | 70 | 100 | 100 |
| 18 | 2.0 | 1.2 | 1.2 | 1.0 | 140 | 100 | 100 |
| 19 | 3.2 | 1.6 | 1.6 | 0.6 | 30 | 30 | 100 |
| 20 | 3.2 | 1.6 | 1.6 | 0.6 | 60 | 30 | 100 |
| 21 | 3.2 | 1.6 | 1.6 | 0.6 | 120 | 30 | 100 |
| 22 | 3.2 | 1.6 | 1.6 | 0.6 | 30 | 60 | 100 |
| 23 | 3.2 | 1.6 | 1.6 | 0.6 | 60 | 60 | 100 |
| 24 | 3.2 | 1.6 | 1.6 | 0.6 | 120 | 60 | 100 |
| 25 | 3.2 | 1.6 | 1.6 | 0.6 | 30 | 120 | 100 |
| 26 | 3.2 | 1.6 | 1.6 | 0.6 | 60 | 120 | 100 |
| 27 | 3.2 | 1.6 | 1.6 | 0.6 | 120 | 120 | 100 |
| 28 | 2.0 | 1.2 | 1.2 | 0.6 | 35 | 25 | 100 |
| 29 | 2.0 | 1.2 | 1.2 | 0.6 | 70 | 25 | 100 |
| 30 | 2.0 | 1.2 | 1.2 | 0.6 | 140 | 25 | 100 |
| 31 | 2.0 | 1.2 | 1.2 | 0.6 | 35 | 50 | 100 |
| 32 | 2.0 | 1.2 | 1.2 | 0.6 | 70 | 50 | 100 |
| 33 | 2.0 | 1.2 | 1.2 | 0.6 | 140 | 50 | 100 |

TABLE 1-continued

| Sample Number | Length Direction Dimension [mm] | Width Direction Dimension [mm] | Thickness Direction Dimension [mm] | Thickness of Internal Electrode [μm] | Thickness of Outer Layer [μm] | Width Direction Gap [μm] | Defect Generation Ratio [%] |
|---|---|---|---|---|---|---|---|
| 34 | 2.0 | 1.2 | 1.2 | 0.6 | 35 | 100 | 100 |
| 35 | 2.0 | 1.2 | 1.2 | 0.6 | 70 | 100 | 100 |
| 36 | 2.0 | 1.2 | 1.2 | 0.6 | 140 | 100 | 100 |

TABLE 2

| Sample Number | Length Direction Dimension [mm] | Width Direction Dimension [mm] | Thickness Direction Dimension [mm] | Thickness of Internal Electrode [μm] | Thickness of Outer Layer [μm] | Width Direction Gap [μm] | Defect Generation Ratio [%] |
|---|---|---|---|---|---|---|---|
| 37 | 3.2 | 1.6 | 1.6 | 0.4 | 30 | 30 | 0 |
| 38 | 3.2 | 1.6 | 1.6 | 0.4 | 60 | 30 | 0 |
| 39 | 3.2 | 1.6 | 1.6 | 0.4 | 120 | 30 | 0 |
| 40 | 3.2 | 1.6 | 1.6 | 0.4 | 30 | 60 | 0 |
| 41 | 3.2 | 1.6 | 1.6 | 0.4 | 60 | 60 | 100 |
| 42 | 3.2 | 1.6 | 1.6 | 0.4 | 120 | 60 | 100 |
| 43 | 3.2 | 1.6 | 1.6 | 0.4 | 30 | 120 | 0 |
| 44 | 3.2 | 1.6 | 1.6 | 0.4 | 60 | 120 | 100 |
| 45 | 3.2 | 1.6 | 1.6 | 0.4 | 120 | 120 | 100 |
| 46 | 2.0 | 1.2 | 1.2 | 0.4 | 35 | 25 | 0 |
| 47 | 2.0 | 1.2 | 1.2 | 0.4 | 70 | 25 | 0 |
| 48 | 2.0 | 1.2 | 1.2 | 0.4 | 140 | 25 | 0 |
| 49 | 2.0 | 1.2 | 1.2 | 0.4 | 35 | 50 | 0 |
| 50 | 2.0 | 1.2 | 1.2 | 0.4 | 70 | 50 | 100 |
| 51 | 2.0 | 1.2 | 1.2 | 0.4 | 140 | 50 | 100 |
| 52 | 2.0 | 1.2 | 1.2 | 0.4 | 35 | 100 | 0 |
| 53 | 2.0 | 1.2 | 1.2 | 0.4 | 70 | 100 | 100 |
| 54 | 2.0 | 1.2 | 1.2 | 0.4 | 140 | 100 | 100 |
| 55 | 3.2 | 1.6 | 1.6 | 0.4 | 50 | 50 | 100 |
| 56 | 3.2 | 1.6 | 1.6 | 0.2 | 30 | 30 | 0 |
| 57 | 3.2 | 1.6 | 1.6 | 0.2 | 60 | 30 | 0 |
| 58 | 3.2 | 1.6 | 1.6 | 0.2 | 120 | 30 | 0 |
| 59 | 3.2 | 1.6 | 1.6 | 0.2 | 30 | 60 | 0 |
| 60 | 3.2 | 1.6 | 1.6 | 0.2 | 60 | 60 | 41 |
| 61 | 3.2 | 1.6 | 1.6 | 0.2 | 120 | 60 | 73 |
| 62 | 3.2 | 1.6 | 1.6 | 0.2 | 30 | 120 | 0 |
| 63 | 3.2 | 1.6 | 1.6 | 0.2 | 60 | 120 | 80 |
| 64 | 3.2 | 1.6 | 1.6 | 0.2 | 120 | 120 | 97 |
| 65 | 2.0 | 1.2 | 1.2 | 0.2 | 35 | 25 | 0 |
| 66 | 2.0 | 1.2 | 1.2 | 0.2 | 70 | 25 | 0 |
| 67 | 2.0 | 1.2 | 1.2 | 0.2 | 140 | 25 | 0 |
| 68 | 2.0 | 1.2 | 1.2 | 0.2 | 35 | 50 | 0 |
| 69 | 2.0 | 1.2 | 1.2 | 0.2 | 70 | 50 | 40 |
| 70 | 2.0 | 1.2 | 1.2 | 0.2 | 140 | 50 | 92 |
| 71 | 2.0 | 1.2 | 1.2 | 0.2 | 35 | 100 | 0 |
| 72 | 2.0 | 1.2 | 1.2 | 0.2 | 70 | 100 | 68 |
| 73 | 2.0 | 1.2 | 1.2 | 0.2 | 140 | 100 | 100 |
| 74 | 3.2 | 1.6 | 1.6 | 0.2 | 50 | 50 | 24 |

Figure 3:
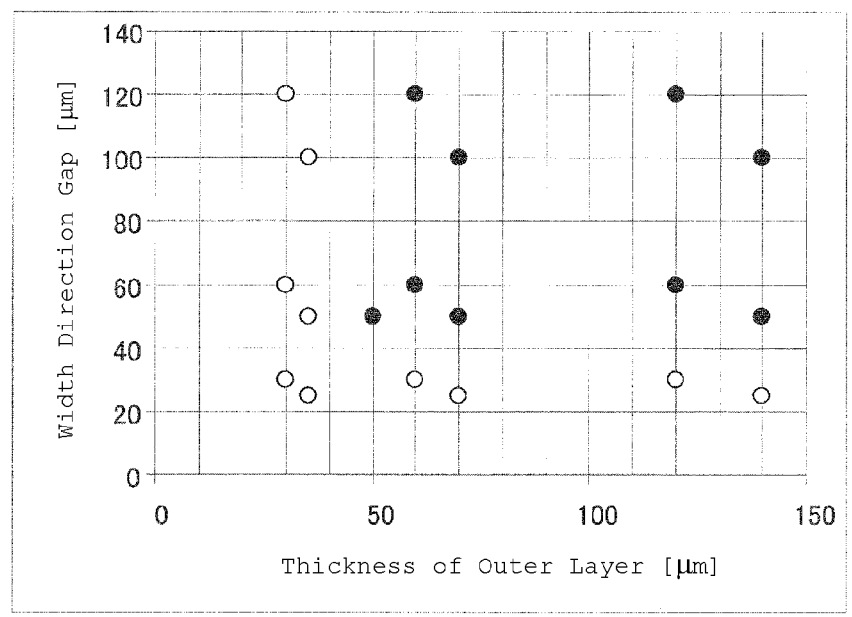
FIG. 3 is a diagram showing distributions of a width-direction gap and an outer layer thickness for samples with an internal electrode of 0.4 μm in thickness among samples prepared in Experimental Example 1, and together showing evaluation results of defect generation for each sample with symbols of ● and ○.
Figure 4:
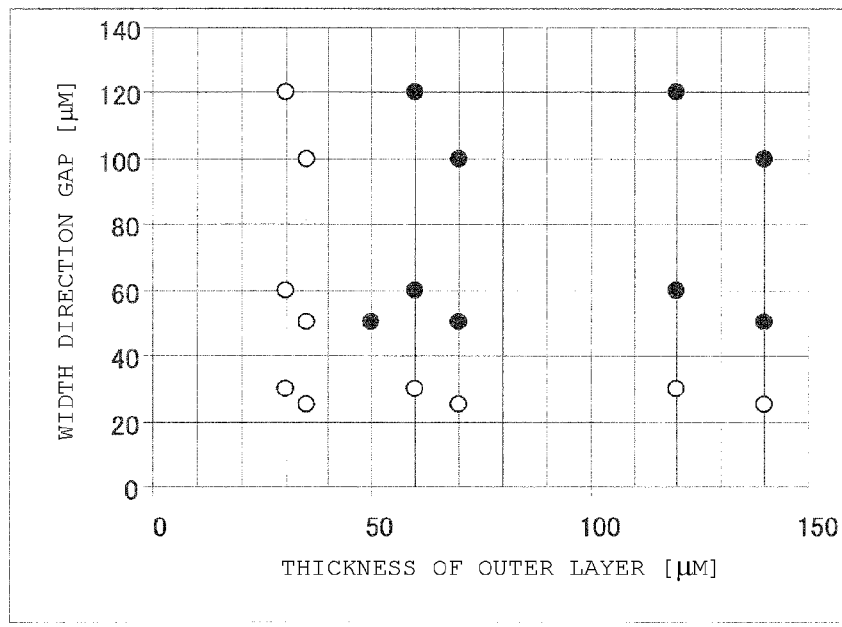
FIG. 4 is a diagram showing distributions of a width-direction gap and an outer layer thickness for samples with an internal electrode of 0.2 μm in thickness among samples prepared in Experimental Example 1, and together showing evaluation results of defect generation for each sample with symbols of ● and ○.

FIGS. 3 and 4 show distributions of the width-direction gap and outer layer thickness for specific samples, and together show the evaluation results of defect generation with symbols of ● and ○. FIG. 3 herein shows samples 37 to 55 of 0.4 μm in the thickness of the internal electrode as shown in Table 2. FIG. 4 shows samples 56 to 65 of 0.2 μm in the thickness of the internal electrode as shown in Table 2.

In FIGS. 3 and 4, the defect generation ratio higher than 0% (particularly in FIG. 3, the defect generation ratio of 100%) is expressed by the symbol ●, whereas the defect generation ratio of 0% is expressed by the symbol ○. When a comparison is made between FIGS. 3 and 4, it is determined that the case of 0.4 μm in the thickness of the internal electrode also has the same tendency as in the case of 0.2 μm in the thickness of the internal electrode.

From Table 1 as well as FIGS. 3 and 4, it is determined that the defect generation ratio of 0% can be achieved as long as the condition of 0.4 μm or less in the thickness of the internal electrode is met, and the condition of 35 μm or less in outer layer thickness or 30 μm or less in width direction gap is met.

Experimental Example 2

In Experimental Example 2, the relationship was evaluated between the coverage for internal electrodes and the defect generation ratio in a thermal shock test.

Through essentially the same steps as in the case of Experimental Example 1, laminated ceramic capacitors according to each sample were obtained which had the external dimensions shown in "Length Direction Dimension", "Width Direction Dimension" and "Thickness Direction Dimension" of Table 3. The laminated ceramic capacitors according to each sample were all adjusted to 0.4 µm in the thickness of the internal electrode, 30 µm in width direction gap, and 35 µm in outer layer thickness. Then, the coverage for the internal electrodes was varied as shown in the column "Coverage" of Table 3, by controlling the maximum temperature in the firing step between 1100° C. and 1300° C.

For each of the obtained samples, the "Thickness of Internal Electrode", "Width Direction Gap", and "Outer Layer Thickness" were measured in the same way as in Experimental Example 1 to confirm that nearly the targeted values were achieved as described above.

In addition, the coverage for the internal electrodes was also nearly the targeted value.

For each of the obtained samples, a thermal shock test was carried out in the same manner as in the case of Experimental Example 1, except that the temperature of the solder bath was set as shown in the column "Solder Bath Temperature" of Table 3, and the ratio of the number of samples with structural defects generated was figured out. The results are shown in the column "Defect Generation Ratio" of Table 3.

TABLE 3

| Sample Number | Length Direction Dimension [mm] | Width Direction Dimension [mm] | Thickness Direction Dimension [mm] | Coverage [%] | Solder Bath Temperature [° C.] | Defect Generation Ratio [%] |
| --- | --- | --- | --- | --- | --- | --- |
| 101 | 3.2 | 1.6 | 1.6 | 48 | 400 | 26 |
| 102 | 3.2 | 1.6 | 1.6 | 62 | 400 | 13 |
| 103 | 3.2 | 1.6 | 1.6 | 75 | 400 | 0 |
| 104 | 3.2 | 1.6 | 1.6 | 97 | 400 | 0 |
| 105 | 3.2 | 1.6 | 1.6 | 46 | 450 | 57 |
| 106 | 3.2 | 1.6 | 1.6 | 65 | 450 | 27 |
| 107 | 3.2 | 1.6 | 1.6 | 76 | 450 | 0 |
| 108 | 3.2 | 1.6 | 1.6 | 92 | 450 | 0 |
| 109 | 3.2 | 1.6 | 1.6 | 44 | 500 | 88 |
| 110 | 3.2 | 1.6 | 1.6 | 58 | 500 | 52 |
| 111 | 3.2 | 1.6 | 1.6 | 79 | 500 | 0 |
| 112 | 3.2 | 1.6 | 1.6 | 95 | 500 | 0 |

From Table 3, it can be confirmed that meeting the condition that the coverage for the internal electrodes is 75% or more is more effective for the reduction in defect generation ratio.

More specifically, in FIG. 3, when attention is paid to the "Coverage" for the samples with the "Defect Generation Ratio" of 0%, the "Defect Generation Ratio" is 0% with the "Coverage" of 75% or more in the case of the "Solder Bath Temperature" of 400° C. From the foregoing, it is first determined that the "Coverage" is preferably 75% or more at least against the thermal shock of 400° C.

The "Coverage" is preferably higher against thermal shocks of higher temperatures, and more specifically, the "Defect Generation Ratio" is 0% with the "Coverage" of 76% or more in the case of the "Solder Bath Temperature" of 450° C., whereas the "Defect Generation Ratio" is 0% with the "Coverage" of 79% or more in the case of the "Solder Bath Temperature" of 500° C.

DESCRIPTION OF REFERENCE SYMBOLS 1 laminated ceramic capacitor
2 laminated body
3 ceramic layer
4,5 internal electrode
6,7 principal surface
8,9 side surface
10,11 end surface

The invention claimed is:

1. A method for manufacturing a laminated ceramic electronic component, the method comprising:
providing a first plurality of ceramic green sheets;
printing conductive paste films on the first plurality of ceramic green sheets in a thickness that results in internal electrodes of 0.4 µm or less in thickness after firing;
providing a second plurality of ceramic green sheets without conductive paste films thereon;
stacking the first plurality of green sheets with the conductive paste films thereon and the second plurality of ceramic green sheets to form an unsintered body; and
firing the unsintered body at a temperature greater than 1000° C. to form a laminated body that includes a plurality of stacked ceramic layers and a plurality of internal electrodes located between the ceramic layers, a pair of mutually opposed principal surfaces extending in a direction in which the ceramic layers extend, a pair of mutually opposed side surfaces and a pair of mutually opposed end surfaces, the side surfaces and the end surfaces respectively extending in directions orthogonal to the principal surfaces, the plurality of internal electrodes including a first set of internal electrodes that extend to a first end surface of the pair of end surfaces and a second set of internal electrodes that extend to a second end surface of the pair of end surfaces, the plurality of internal electrodes being distributed in an area defined by a width-direction gap interposed with respect to each of the pair of side surfaces and an outer layer thickness interposed with respect to each of the pair of principal surfaces, the coverage of the internal electrodes is 75% or more, and at least one of (1) the width-direction gap is 30 µm or less and (2) the outer layer thickness is 35 µm or less.

2. The method for manufacturing a laminated ceramic electronic component according to claim 1, wherein both the width-direction gap is 30 µm or less and the outer layer thickness is 35 µm or less.

3. The method for manufacturing a laminated ceramic electronic component according to claim 1, wherein the plurality of internal electrodes are no less than 0.05 μm in thickness after firing.

4. The method for manufacturing a laminated ceramic electronic component according to claim 3, wherein the width-direction gap is no less than 5 μm.

5. The method for manufacturing a laminated ceramic electronic component according to claim 4, wherein the outer layer thickness is no less than 5 μm.

6. The method for manufacturing a laminated ceramic electronic component according to claim 1, wherein the width-direction gap is no less than 5 μm.

7. The method for manufacturing a laminated ceramic electronic component according to claim 1, wherein the outer layer thickness is no less than 5 μm.

8. The method for manufacturing a laminated ceramic electronic component according to claim 2, wherein the plurality of internal electrodes are no less than 0.05 μm in thickness after firing.

9. The method for manufacturing a laminated ceramic electronic component according to claim 8, wherein the width-direction gap is no less than 5 μm.

10. The method for manufacturing a laminated ceramic electronic component according to claim 9, wherein the outer layer thickness is no less than 5 μm.

11. The method for manufacturing a laminated ceramic electronic component according to claim 2, wherein the width-direction gap is no less than 5 μm.

12. The method for manufacturing a laminated ceramic electronic component according to claim 2, wherein the outer layer thickness is no less than 5 μm.

13. The method for manufacturing a laminated ceramic electronic component according to claim 1, wherein the conductive paste contains Ni.

* * * * *